(12) United States Patent
Mok et al.

(10) Patent No.: US 7,795,584 B2
(45) Date of Patent: Sep. 14, 2010

(54) AUTOMATED DISPENSER WITH SENSOR ARRANGEMENT

(75) Inventors: Kin Lun Mok, Hong Kong (CN); King Lun Mok, Hong Kong (CN); Hong Ng, Hong Kong (CN)

(73) Assignee: SCA Hygiene Products AB, Gothenburg (SE)

( * ) Notice: Subject to any disclaimer, the term of this patent is extended or adjusted under 35 U.S.C. 154(b) by 205 days.

(21) Appl. No.: 11/971,416

(22) Filed: Jan. 9, 2008

(65) Prior Publication Data

US 2008/0116356 A1 May 22, 2008

Related U.S. Application Data

(63) Continuation of application No. PCT/EP2005/007616, filed on Jul. 13, 2005.

(51) Int. Cl.
*H01L 27/00* (2006.01)

(52) U.S. Cl. .................. 250/338.1; 225/10; 225/11; 225/15

(58) Field of Classification Search .......... 250/338.1; 225/10–16, 34

See application file for complete search history.

(56) References Cited

U.S. PATENT DOCUMENTS

| | | |
|---|---|---|
| 4,467,251 A | 8/1984 | Jonsson |
| 4,560,912 A | 12/1985 | Jonsson |
| 4,742,583 A | 5/1988 | Yoshida et al. |
| 5,031,258 A | 7/1991 | Shaw |
| 5,375,785 A | 12/1994 | Boone et al. |
| 5,393,482 A | 2/1995 | Benda et al. |
| 5,526,973 A | 6/1996 | Boone et al. |

(Continued)

FOREIGN PATENT DOCUMENTS

CN 2520141 Y 11/2002

(Continued)

OTHER PUBLICATIONS

International Search Report of PCT/EP2005/007616 filed Jul. 13, 2005, date of mailing May 29, 2006.

(Continued)

*Primary Examiner*—David P Porta
*Assistant Examiner*—Casey Bryant
(74) *Attorney, Agent, or Firm*—Young & Thompson

(57) ABSTRACT

An automatic electrically powered dispenser for dispensing a product stored in the dispenser includes an active IR sensor system for detecting a user. The IR sensor system includes at least one IR emitter and at least one IR receiver. The IR sensing system is arranged to scan for the presence of a possible user at a certain scanning rate. A sensor control system supplies the active IR emitter(s) with a first current which is constant during one or more single scans and is altered to a different, second current for further scanning. The first and second currents are determined on the basis of a signal strength of the average received IR which is received by the IR receiver(s) during a number of previous single scans. In a simplified system, the average value of the most recently received IR values may be compared to a standard value set in the control system to alter the current supplied to the IR emitter(s).

24 Claims, 8 Drawing Sheets

U.S. PATENT DOCUMENTS

| | | |
|---|---|---|
| 5,691,919 A | 11/1997 | Gemmell et al. |
| 5,772,291 A | 6/1998 | Byrd et al. |
| 6,069,354 A | 5/2000 | Alfano et al. |
| 6,695,246 B1 | 2/2004 | Elliott et al. |
| 6,710,606 B2 | 3/2004 | Morris |
| 6,736,348 B1 | 5/2004 | Formon et al. |
| 6,830,210 B2 | 12/2004 | Formon et al. |
| 6,871,815 B2 | 3/2005 | Moody et al. |
| 6,903,654 B2 | 6/2005 | Hansen et al. |
| 6,988,689 B2 | 1/2006 | Thomas et al. |
| 7,017,856 B2 | 3/2006 | Moody et al. |
| 7,114,677 B2 * | 10/2006 | Formon et al. ........... 242/564.3 |
| 7,182,289 B2 | 2/2007 | Moody et al. |
| 7,191,977 B2 | 3/2007 | Denen et al. |
| 7,237,744 B2 | 7/2007 | Morris et al. |
| 7,296,765 B2 | 11/2007 | Rodrian |
| 7,341,170 B2 | 3/2008 | Boone |
| 7,387,274 B2 | 6/2008 | Moody et al. |
| 2002/0088837 A1 | 7/2002 | Formon et al. |
| 2002/0109034 A1 | 8/2002 | Moody et al. |
| 2003/0168489 A1 | 9/2003 | Formon et al. |
| 2003/0168549 A1 | 9/2003 | Formon et al. |
| 2003/0168550 A1 | 9/2003 | Formon et al. |
| 2003/0169046 A1 | 9/2003 | Morris |
| 2004/0134924 A1 | 7/2004 | Hansen et al. |
| 2004/0251375 A1 | 9/2004 | Denen et al. |
| 2005/0077419 A1 | 4/2005 | Thomas |
| 2005/0150992 A1 | 7/2005 | Morris et al. |
| 2005/0171634 A1 | 8/2005 | York et al. |
| 2006/0006275 A1 | 1/2006 | Neveu et al. |
| 2006/0173576 A1 | 8/2006 | Goerg et al. |
| 2006/0175341 A1 | 8/2006 | Rodrian |
| 2007/0080255 A1 | 4/2007 | Witt et al. |
| 2007/0152010 A1 | 7/2007 | Denen et al. |
| 2007/0158359 A1 | 7/2007 | Rodrian |
| 2007/0194166 A1 | 8/2007 | Reinsel et al. |
| 2008/0011772 A1 | 1/2008 | Morris et al. |
| 2008/0018302 A1 | 1/2008 | Reinsel et al. |
| 2008/0078777 A1 | 4/2008 | Cittadino et al. |
| 2008/0087758 A1 | 4/2008 | Formon et al. |
| 2008/0099595 A1 | 5/2008 | Lewis et al. |

FOREIGN PATENT DOCUMENTS

| | | |
|---|---|---|
| DE | 196 39 285 C1 | 4/1998 |
| EP | 1 383 242 A2 | 1/2004 |
| EP | 0 880 331 | 10/2004 |
| EP | 1 501 193 A1 | 1/2005 |
| EP | 1 716 800 | 11/2006 |
| GB | 2 195 763 A | 4/1988 |
| RU | 2 132 761 C1 | 7/1999 |
| RU | 2 217 265 C2 | 11/2003 |
| WO | 02/00083 | 1/2002 |
| WO | 2005/050253 A1 | 6/2005 |
| WO | WO 2005/050253 A1 | 6/2005 |
| WO | 2005/065509 | 7/2005 |
| WO | 2006/060047 | 6/2006 |
| WO | 2006/065515 | 6/2006 |
| WO | 2007/098419 | 8/2007 |
| WO | 2008/011460 | 1/2008 |
| WO | 2008/042382 | 4/2008 |
| WO | 2008/042962 | 4/2008 |
| WO | 2008/042964 | 4/2008 |
| WO | 2008/053383 | 5/2008 |

OTHER PUBLICATIONS

Chilean Search Report, dated Oct. 28, 2009, from corresponding application.

English Translation of Russian Office Action from corresponding application.

* cited by examiner

AUTOMATED DISPENSER WITH SENSOR ARRANGEMENT

CROSS REFERENCE TO RELATED APPLICATION

This is a continuation of international application PCT/EP2005/007616 filed on 13 Jul. 2005, which designated the United States of America.

FIELD OF THE INVENTION

The present invention relates generally to a dispenser having an active infrared (IR) sensor system, in particular for dispensers of the type including a motor-driven dispensing system combined with control circuitry for sensing the presence of a possible user by means of said IR sensor system and controlling operation of said motor to effect dispensing of material.

The invention furthermore relates particularly to an automatic towel dispenser (preferably with paper towels stored inside the dispenser housing) of the electrically powered type, preferably a battery powered type (but which could also be AC powered or powered by a combination of AC and DC power supplies), in which the IR sensor system is used to control dispensing of products such as paper sheets (e.g. paper hand-towels) when the presence of a possible/potential user is detected to be within a specified zone, without physical contact of the user with the dispenser (or the sensors) being required for initiating the dispensing sequence.

BACKGROUND TO THE INVENTION

Dispensers of the aforementioned type are known for example from U.S. Pat. No. 6,695,246.

In for example the dispenser according to U.S. Pat. No. 6,695,246, the sensor control circuitry uses active IR (i.e. both IR emission and detection) to control sensing of the presence of a possible user. The IR is emitted in pulses. In the active IR mode, the presence of an object (i.e. a possible user) can be detected within a detection zone of about 12 to 24 cm from the dispenser and upon said detection operates a motor to dispense a hand towel to a user. One IR receiver and one IR emitter are located behind a front cover of the dispenser and each is mounted in a respective tube, the tubes being placed adjacent one another. By this arrangement the detection distance is kept short (between about 12 to 24 cm) so that objects which are outside the detection zone do not lead to undesired and unintentional dispensing. Likewise the object must be in the correct position and at a correct angle otherwise the tubes will prevent IR from being reflected back and collected by the receiver. Thus, while the possibility of undesirable reflections from other surfaces or the like is reduced, the sensor system requires fairly accurate positioning of the hand to effect operation. When an object is detected, the microprocessor activates the motor to dispense a towel if two scans with sufficient reflected IR are received the IR sensing control system. In order to operate the motor, the IR sensor system uses a background light level reference circuit which provides a reference voltage $V_B$, related to the level of background light and against which a voltage $V_A$ from the IR sensor is compared. When voltage $V_A$ is greater than voltage $V_B$ the motor may operate to dispense a hand towel. This provides an automatic compensation of background light level so that the signal picked up by the IR receiver must be raised to a higher level in order that a user is detected.

In the aforementioned dispenser, although a certain degree of compensation is made for background light levels which can take account of some conditions, problems will arise in such a device due to temporary effects of high IR changes due to atmospheric conditions, in particular when background IR is very low, since only very small changes in reflected IR can cause dispensing to occur even when not required.

Likewise, the problem would also be encountered that as background IR levels generally increase to a high level, a user's hand becomes harder to distinguish against the background IR because the increased level of IR due to the IR reflection from a user's hand, when the hand is in front of the dispenser, may be approximately at the same level as the background IR, or due to the temporary blocking of the high level background IR, the presence of a hand can even reduce the level to below that of background IR received in the IR sensor, such that the hand in many cases is not reliably detected.

Also, a user's hand which is not detected or is not correctly positioned with respect to the small area of detection of the sensors on the dispenser, i.e. in the small range of area detected and thus which does not immediately activate hand towel dispensing, will often be tempted to touch the dispenser to try and cause dispensing in the belief that touching of the casing close to the sensors is required, despite any written notices which the dispenser may contain in this regard. This is particularly the case because the user's hand is already at the height of the dispenser as in the aforementioned document. This can result in lack of hygiene when several users consecutively touch the dispenser.

Further, while the IR emitted intensity from the emitter is seemingly constant in the aforesaid document (apart from possible variations to low battery voltage), such a construction when relying on battery power from batteries (rather than solar cells) often involves using unnecessarily high power.

The present invention has as one of its objects, to provide an improvement to the active IR detection to take account of background IR changes.

A further object is to improve the possibility of better hygiene.

A further object is to minimize power consumption of the device at certain times by taking into account the background IR level.

Further objects of the invention will be apparent upon reading this specification.

SUMMARY OF THE INVENTION

The main object of the invention is achieved by a dispenser having the features defined in the independent claim. Certain preferred features of the invention are defined in the dependent claims.

Further features of the invention will be apparent to the reader of this specification.

The invention provides a means of improving detection reliability by compensating for background IR levels of increasing or decreasing intensity by means of varying the current supplied to the IR emitter(s), thereby varying the amount of emitted IR used by the sensing system. One way of doing this is when general background IR levels are generally high, the power sent out by the IR emitters is made higher by increasing the current passed through the IR emitter. Thus, a user approaching the dispenser in bright light conditions will more easily be detected, since the amount of reflected IR compared to background IR will be larger than if no current change had been made. Therefore, the difference between received IR from reflection off the user's hand compared to background IR will be greater, and thus the user's hand will be readily detected, which is particularly advantageous when the user's hand is less white due to the lower IR reflection obtained.

Likewise, in low background IR conditions there is often no need for a high current to the emitter, since a user's hand will already give a high percentage increase of reflected IR compared to background IR to be detected. Thus, the current supplied to the emitter(s) can be made lower which also saves power. Similarly, when sudden changes in background IR occur due to e.g. sunlight entering a room or a light being turned on, the lower current to the sensor means that the relative effect of these changes on reflected IR (i.e. that being emitted by the emitter and reflected back to the receiver) compared to background IR will be virtually undetected. However, when a user approaches the dispenser in low background IR conditions, the reflected IR increase received by the IR receiver will be high compared to background IR even at the low current levels.

An alternative, possibly simpler, method which can be used to vary the IR emitter(s) current, rather than by comparing (as above) the values of reflection to background levels, is to set a so-called "standard value" (a threshold value) in the control circuitry, which is a value of the expected detected signal strength to be received in normal operating conditions. The current supplied might be e.g. 5 mA at this standard value. If this standard value set in the system is called $A1$, then during operation, the control circuitry (MCU thereof) can be made to calculate the IR level, $A2$, from a predetermined number of the most recently received IR values (i.e. the moving average of the most recent values). If $A2>A1$ (i.e. the detected reflection moving average signal level $A2$ is above the stored standard signal level $A1$), as calculated in the MCU for example, the current supplied to the emitter can be reduced, preferably in increments. Conversely, in the case where $A2<A1$, then the current supplied to the emitters can be increased, preferably incrementally.

The sensors in the inventive dispenser are preferably positioned such that the IR emitters create a wide and useful IR detection zone and the IR detectors (i.e. IR receivers) are arranged to prevent IR from the emitters directly entering the receivers and also to reduce IR reflections from other directions.

Any locations on the dispenser or sensors etc., are defined with respect to the dispenser in its normal position of use and not mounted upside down or the like. Thus, the lower part of the dispenser is intended to be at the bottom. Likewise, the lateral direction of the dispenser is in a generally horizontal direction.

Where a vertical direction or plane is referred to, this is normally intended to refer to the generally vertical direction. When the dispenser is mounted on a true vertical wall (as will be described later with reference to FIG. 2 for example), the vertical direction is thus a true vertical direction. If however, the wall is slightly inclined by a few degrees, a vertical direction referred to with respect to the dispenser will also be inclined by the same amount and in the same direction as the wall inclination.

Partly due to the good coverage of the sensor system which can detect potential (possible) users at a sufficient distance from a large range of the normal positions of approach to the dispenser, and due to the compensatory current that is applied to allow better detection, this allows the system to react to a user's presence early, and thus enables the dispenser to be designed to consume low power. This reduced power consumption is possible since in periods when a possible user (i.e. an object assumed to be a user requiring dispensing of a product such as a length of hand towel or toilet paper) is not located near the dispenser, the scanning rate, in addition to the lower current supplied to the emitters, can also be lowered, without any appreciable risk that the scanning rate will be too low to react quickly enough when a product should be dispensed by a user being detected. When the user is detected, the scanning rate is thus changed to a faster rate.

Low power consumption is particularly important in dispensers which are entirely battery powered by a battery or batteries, which are generally expected to operate for a long time (e.g. enough time to dispense 60 or more rolls of paper without requiring battery replacement) and the improved arrangement of sensors and the sensing control system allows less power to be used at times when no users are present requiring a product to be dispensed.

The scanning rate, i.e. the number of scans performed per second, is made to vary upon the location of a user with respect to the dispenser, such that the dispenser operates at a first scanning rate (i.e. performs a scanning sequence by activating IR receiver and emitter circuits, and then emitting scanning pulses at a first number of single scans, i.e. pulses, per second) when no possible/potential user is detected. The system then increases the scanning rate when a user is considered to be close to the dispenser (i.e. has entered a "first" detection zone). This variable scanning rate allows very low power to be used when no users are adequately close to the dispenser, since each scan requires a certain amount of power and the number of scans per second can be reduced, and only to use a higher power level (more scans per second) when required, so that a quick reaction time to dispense a product is experienced by the user.

The dispenser sensing system may be further improved to reduce power consumption, by providing an additional remote sensor linked by either a wire connection to the dispenser or by a wireless link (e.g. IR or radio) to the dispenser. This additional sensor can be used to detect e.g. a user entering a washroom in which the dispenser is placed at a different location to the entrance and thus can cause the first scanning rate to change to the second scanning rate. Such a "remote" sensor could, if desired alternatively be mounted on the front-facing portion of the dispenser and could be arranged to operate at a very slow scanning rate due to the distance of the entry to a washroom from the location of the dispenser, such that by the time the possible user wishes to use a dispenser and has thus moved closer to the dispenser, the dispenser is already operating at a higher second scanning rate allowing rapid detection by the active IR sensor system of the dispenser defined in the claims.

Alternatively, the same set of active IR sensors as defined in the claims which are used to cause the dispenser to dispense a product upon detection of a possible user, can also be used to detect a user entering a first detection zone. In this way, a user approaching the dispenser (e.g. 40 to 50 cm or perhaps further away from the dispenser) will activate the sensor system to change the scanning rate to a higher scanning rate and as the user continues to move his/her hands and/or body closer to the discharge outlet of the dispenser, the user will be detected as being in a "dispensing zone" and will thus cause the dispenser to dispense a product (e.g. a paper hand towel or paper toilet toil).

If desired, more than two scanning rates can be used. For example a first slow scanning rate can be used (such as 1 or 2 times per second), followed by a higher second scanning rate (at e.g. 3 to 6 times per second), followed by a further higher rate (e.g. 7 to 12 times per second), whereby the scanning rate is increased from one rate to the next as the user is detected to be moving closer to the dispenser. This can be performed by a series of different sensors for example, each detecting at different distances, with the final sensor system being as defined in the appended claims, or for example by arranging the same set of sensors to detect an increased IR signal reflection from the user as the user comes closer to the dispenser.

When a user moves away from the dispenser, the scanning rate can then be decreased again to a lower rate, thereby consuming less sensor operation power.

As will be apparent, even at relatively short distances for the first detection zone (e.g. up to about 50 cm from the dispenser for example at an angle of about 10° to about 45°, or about 30 to about 60°, to the vertical plane slanted in a forward direction away from the rear of the dispenser and downward), the system has significant power saving advantages while still allowing a good reaction time to dispense a towel.

This is because the user expects to move his/her hands relatively close to the device in order for dispensing to occur and this takes of the order of between a quarter and half a second at normal hand movement speeds (between 0.2 m/s and 0.5 m/s), by which time the dispenser can be made to be already scanning at the second higher rate (or even a still higher rate) and thus be able to dispense very close to the time when the hands are in an "expected" position for dispensing (i.e. a position at which the user would expect a towel to be dispensed, typically some 15 to 25 cm from the dispenser outlet).

Likewise, it is preferred that when using the IR sensor system, the sensor system should preferably be able to cope with singular anomalies of short term high IR reflections as sometimes occurs which might not be compensated purely by the current level currently being applied to the emitter, without dispensing a towel, so that it is appropriate to sense two or more consecutive scans, or e.g. a predetermined number of scans in a number of consecutive scans (e.g. two out of three consecutive scans), each being at a predetermined level of IR above background IR level, before dispensing a product.

Advantageous use can be made of the varied scanning rate by making the first scanning rate between e.g. 0.15 and 0.25 seconds between scans (i.e. the scanning rate when a possible user is outside the first detection zone) or even longer (such as between 0.25 seconds and 0.5 seconds), and the second scanning rate of the order of about 0.08 to 0.12 seconds between scans and requiring only two consecutive scans (or e.g. two out of three consecutive scans) providing a reflected IR level above background IR level to activate dispensing. Such dispensing will be perceived as almost immediate, yet a significant amount of power used by the sensor system can be saved due to the initial low scanning rate which consumes less power.

BRIEF DESCRIPTION OF THE DRAWINGS

The invention will now be explained in more detail with reference to certain non-limiting embodiments thereof and with the aid of the accompanying drawings, in which.

DETAILED DESCRIPTION OF PREFERRED EMBODIMENTS

Figure 1:
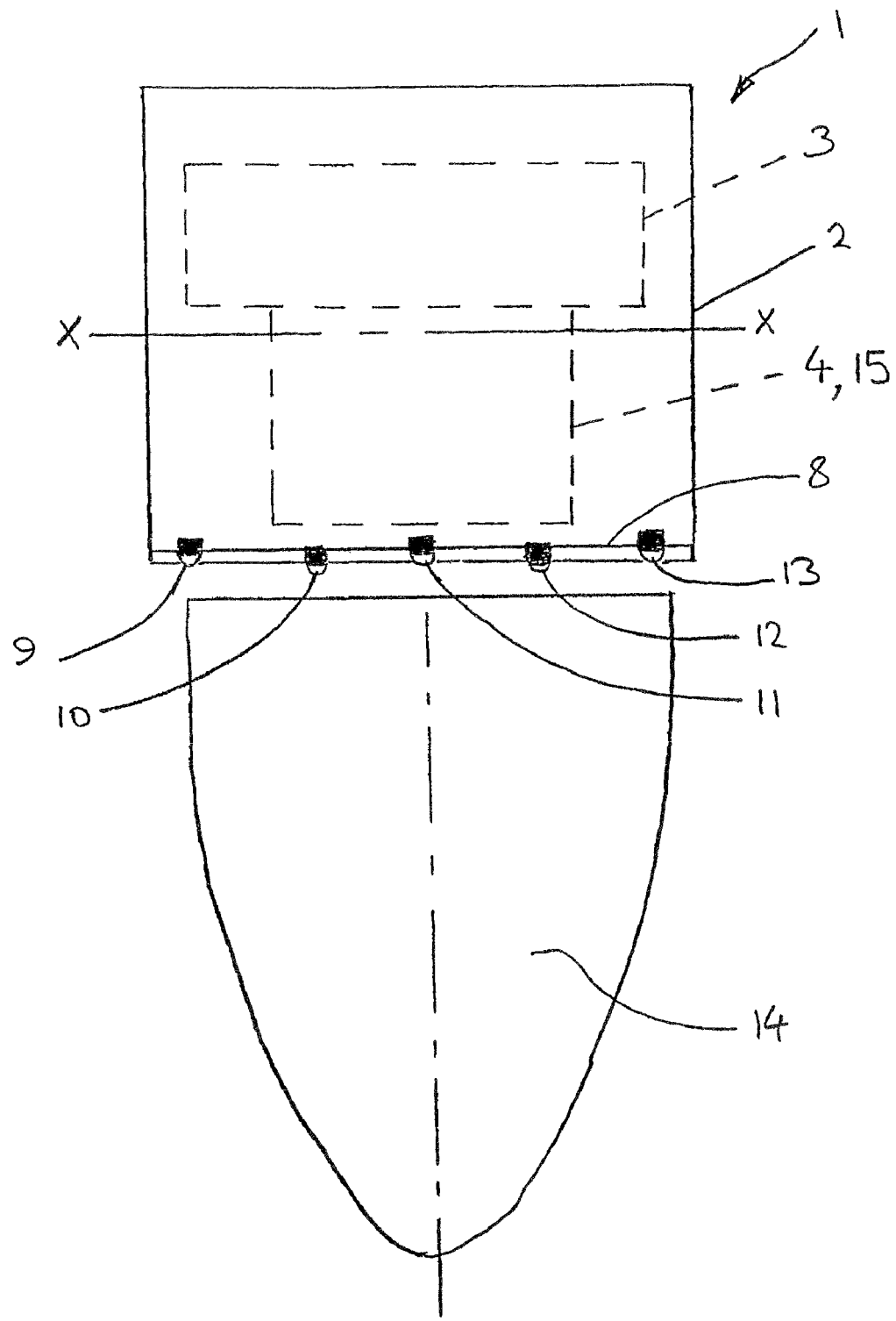
FIG. 1 shows a schematic front view of a paper towel dispenser, depicting a schematic view of a first detection zone.
Figure 2:
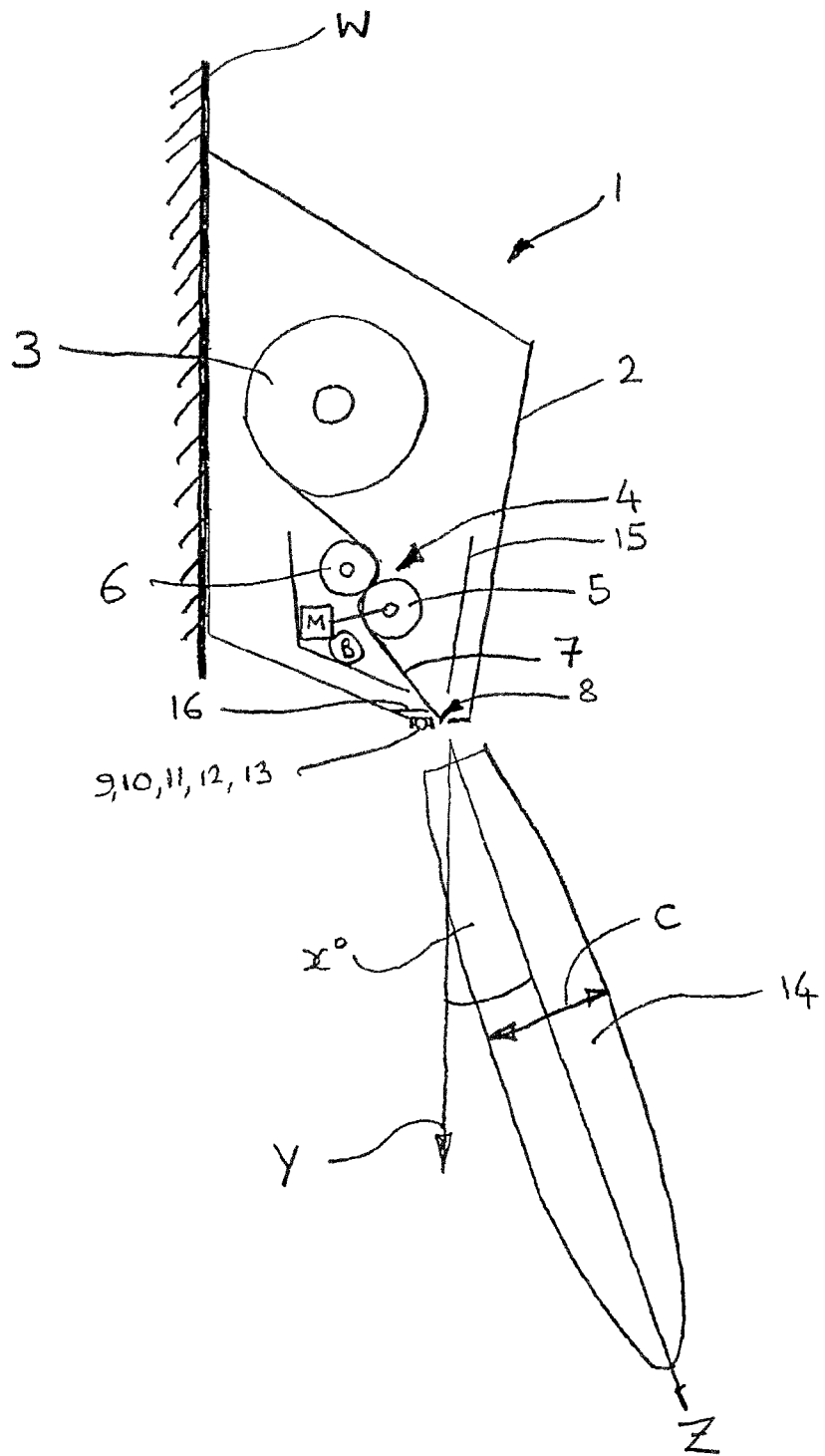
FIG. 2 shows a side view of the arrangement in FIG. 1 whereby a side panel of the dispenser has been removed to show schematic details of the paper roll and paper transport mechanism.

FIG. 1 and FIG. 2 show a dispenser 1 in front and side views respectively, whereby FIG. 2 shows the dispenser 1 attached at its rear side to a wall W (the means of attachment are not shown but may be of any suitable type such as screws, adhesive, or other attachment means), whereby the rear surface of the dispenser lies against said wall W which is normally vertical.

The dispenser 1 comprises a housing 2, within which is located a product supply, in this case a supply of paper in a roll 3. The roll 3 is suitably a roll of continuous non-perforated paper, but may also comprise perforated paper. Also located in the housing 2 is a paper transport mechanism 4 preferably in the form of a modular drive cassette with its own casing 15, which can preferably be removed as a single unit from the housing 2 when the housing is opened.

FIG. 1 shows the paper roll 3 and the transport mechanism 4 which feeds paper from the roll towards a discharge outlet (see further description below), as simple blocks for the sake of simplicity. Likewise FIG. 2 shows the paper roll 3 and the transport mechanism 4 in a vastly simplified form, whereby the transport mechanism includes a drive roller 5 engaged with a counter roller 6, whereby a portion of the paper sheet 7 is shown located between said rollers 5, 6, with the leading edge of said paper sheet 7 ready to be dispensed at a discharge outlet 8 formed in the housing 2 at the lower side thereof.

The drive roller 5 is shown schematically connected to an electrical drive motor M powered by batteries B. A gearing, typically in a gearbox, may be included between the motor drive shaft and the drive roller 5. Suitable batteries may supply a total of 6V when new and typically four 1.5V batteries are suitable for this purpose. Exemplary of suitable types are Duracell's MN1300 batteries, whereby each battery has a capacity of 13 Ah, and which can operate from full to total discharge between the range of 1.5V to 0.8V. Operation of the motor M causes drive roller 5 to rotate and to thereby pull paper sheet 7 from the paper roll 3 by pinching the paper between the nip of the rollers 5 and 6. Upon actuation, the motor rotates thereby withdrawing paper sheet from the roll 3, which also rotates so as to allow paper to be moved towards the discharge opening 8. Other forms of drive mechanisms for withdrawing paper from a roll may also be used. The details of the paper transport mechanism or other product transport mechanism are however not important for an understanding of the invention. Such devices are also well known per se in the art.

It will also be understood from the foregoing that drive roller 5 and counter roller 6 may have their functions swapped such that the counter roller 6 could be the drive roller which is operably connected to the drive motor (and thus the drive roller 5 depicted in FIG. 2 only acts as a counter roller in contact with roller 6, normally with paper or towel in the nip therebetween).

Although the principle of operation is explained using paper in the form of a continuous paper sheet in a roll, it is to be understood that the dispenser may be used to dispense other products from a product supply, such as a continuous piece of paper in concertina format for example. Alternative products may be dispensed by the device with appropriate redesign thereof. It is also possible that other dispensing devices are tagged on to the dispenser. For example the dispenser may further include an air freshener which is activated for example once every 5 or 10 minutes (or other suitable time) or once upon a certain number of towels dispensed. This extra tagged-on dispenser can be controlled by the dispenser control circuitry (to be described below) or by separate control circuitry (not described herein).

The motor M is at rest and without power applied to it when no paper is to be dispensed. The motor M is rotated when paper is to be dispensed through the discharge opening 8. The operation of the motor M is controlled by a master control unit (not shown in FIGS. 1 and 2, but described below) connected to a sensing system comprising sensors 9-13, of which sensors 10 and 12 are emitters, preferably IR emitters, and sensors 9, 11, and 13 are IR receivers. Such IR emitters and receivers are well known in the art and typically comprise diode structures. Suitable IR emitters and receivers are for example made by Lite-ON Electronics Inc., under Type number LTE-3279K for the IR emitters and under Type number LTR-323 DB for the receivers. Other types of IR emitters and receivers may also be used of course. In the shown embodiment, the IR emitters 10, 12 and IR receivers 9, 11, 13, are shown approximately equally spaced consecutively in the lateral direction X-X of the housing (generally parallel to the product supply roll 3). The spacing can suitably be about 5 cm spacing between a consecutive emitter and receiver, such that the distance between sensors 9 and 10, 10 and 11, 11 and 12, 12 and 13 are all approximately equal.

The emitters and receivers are shown (see FIG. 2) placed on the rearmost side of the discharge outlet 8. Other arrangements of sensors are also possible such as all sensors placed on the front-facing side of the outlet, preferably in a straight row along the discharge outlet. The sensors could alternatively be placed on either side of the discharge outlet (e.g. emitters on one side and receivers on the other side) and likewise extend along the discharge outlet. The discharge outlet could however be alternatively placed elsewhere. The arrangement of sensors shown consecutively in the order receiver/emitter/receiver . . . /emitter/receiver with a correct spacing allows an advantageous shape of detection zone 14, which is somewhat tongue-like in shape (see FIGS. 1, 2 and 3B). The underlying tongue shape can be altered somewhat depending on power applied to the emitters and also their extent of protrusion from their housing surface and also the extent of recessing of the IR receivers as well as by their spacing.

With the understanding from this description that a tongue-shaped detection zone is produced due to the spacing between sensors, to a small extent by the power supplied, and due to the recessing/protruding relationships of the IR emitters and receivers, the skilled person will be able to readily vary the tongue shape to meet more precise needs of the dispenser in any special situation or dispenser size, merely by routine experimentation.

The dispenser 1, upon detection of a possible user (the detection process being described further below) without any contact of the user with the dispenser or the sensors, for a sufficient time in the first detection zone, determines that a user is present in a dispensing zone and thus dispenses a product. Dispensing in this case is performed by the front portion of the paper 7 being discharged automatically through discharge opening 8 (i.e. a laterally extending opening, in the lower part of the housing, and preferably feeding out downwards). This allows the user to grasp the paper 7 and to draw it against a cutting edge such as cutting edge 16 shown in FIG. 2, proximate the discharge opening 8, so as to remove the torn/cut-off piece of paper. The location of the cutting edge 16 may of course be varied, such as to be at the level of, or up to 1 cm below, and opposite to, the roller 5.

Figure 3A:
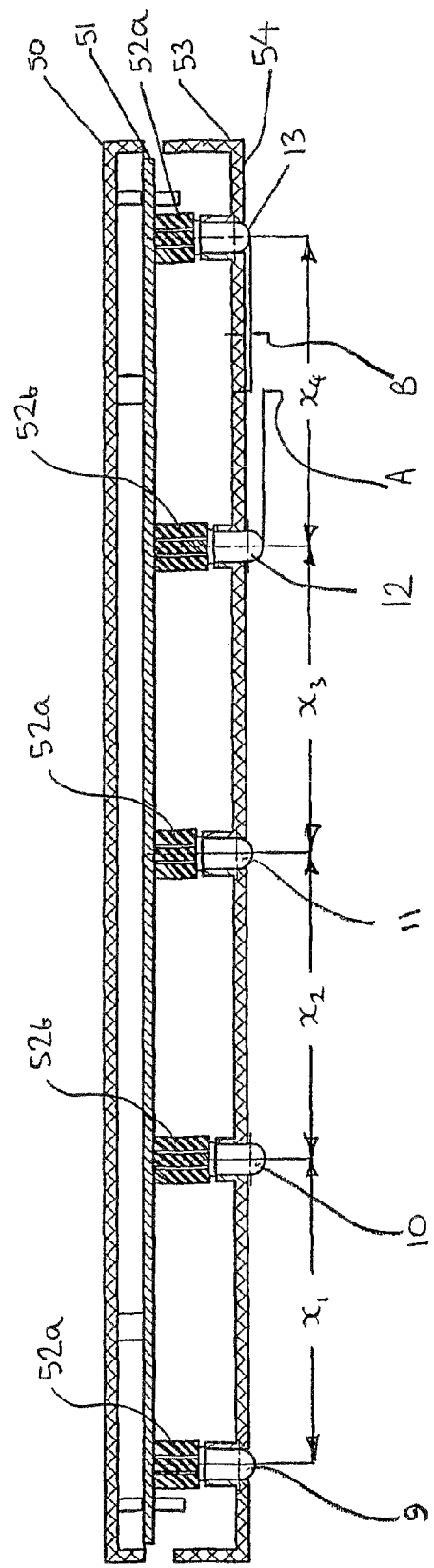
FIG. 3A is a sectional enlarged view, showing further detail than, and taken through, the lower part of the casing shown in FIG. 1, also from the front and at the location of the IR sensors.
Figure 3B:
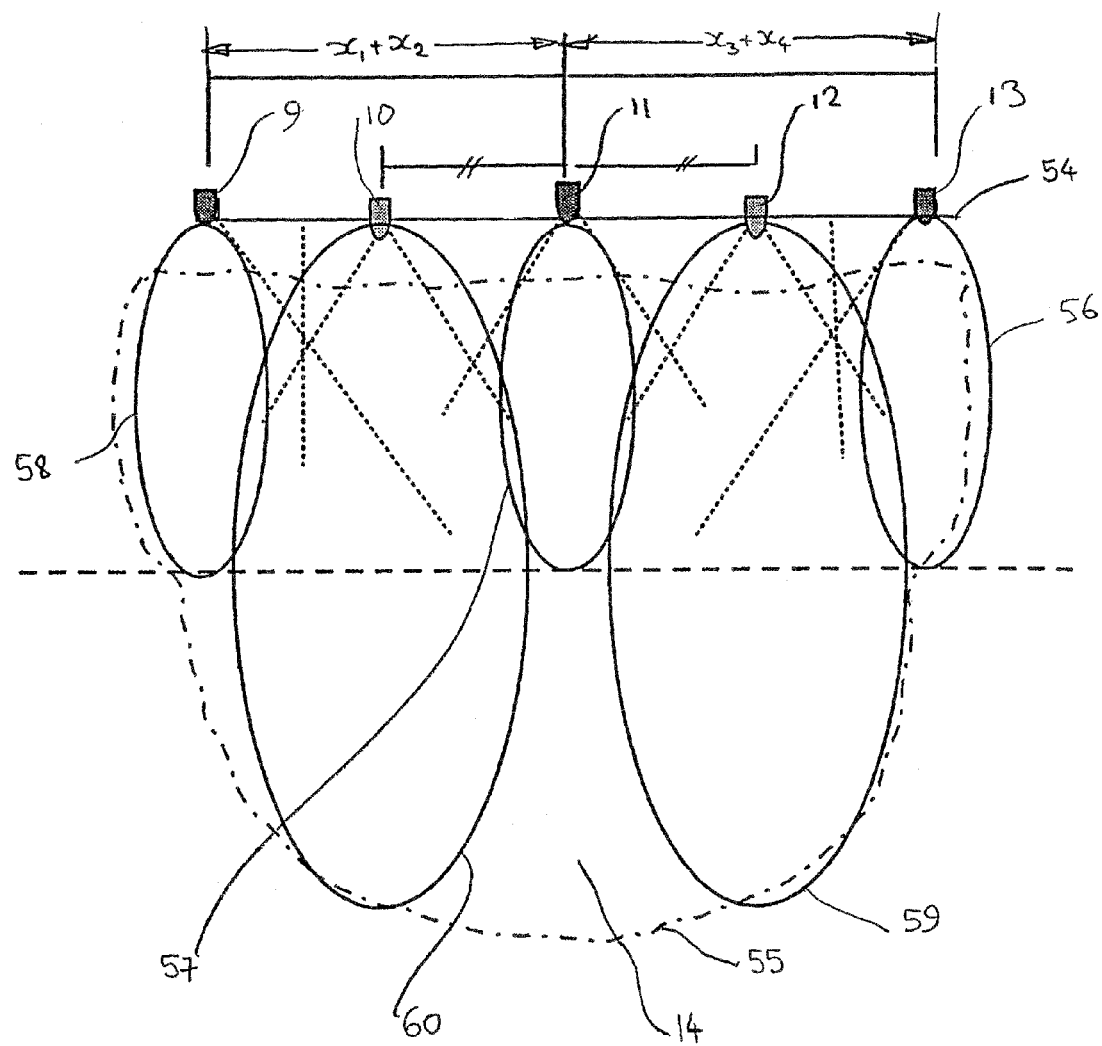
FIG. 3B is a schematic diagram of a frontal view of the arrangement shown in FIG. 3A, depicting the approximate frontal view of the first detection zone achieved by the active IR sensor arrangement.

The first detection zone 14 as shown in FIGS. 1, 2 and 3B is shown as tongue-like and is inclined downwardly and forwardly of the discharge opening at an angle x° of preferably between 20° to 30° to the vertical axis Y. This is achieved by mounting the IR emitters and receivers at between 20° and 30° to the vertical plane which extends laterally across the dispenser. The angle at which each of the emitters and receivers is inclined may vary up to a few degrees, but is generally equal for all emitters and receivers so as to produce a better detection zone. The sensor system is thus able to detect for a vast majority of its full extent, typically between 10 and 60 cm, in direction Z over an angle of some 10° to 45° to the vertical plane (i.e. a detection in a zone somewhat corresponding to the zone 14 shown in FIG. 2).

Details of one preferred arrangement of emitters and receivers with respect to the casing will now be explained with respect to FIG. 3A. The emitters and receivers in this case may suitably be the Lite-ON emitters and receivers described above.

The lower portion of the dispenser comprises a first cover 50 attached to which is the main PCB (printed circuit board) for the sensors 9-13 which are emitters and receivers as described above. To this PCB are attached a series of holders 52a and 52b holding each of the sensors. The receiver holders 52a are shorter than the emitter holders 52b in order to provide a means of recessing the receivers 9, 11, 13 more than the emitters with respect to a flat planar outer cover 53, which in the case shown is provided with varying length recesses. Outer cover 53 can be attached to the emitters and receivers by a frictional fit for example in the case it is decided to fit these as a single unit, although outer cover 53 may also be attached to the PCB or the first cover 50 where desired.

As can be seen in FIG. 3A each of the recesses in which the emitters and receivers are placed are substantially circular. If conical shaped recesses are provided for example, the extent of protrusion of the active part of the emitters, and the extent of protrusion of the active part of the receivers (i.e. for the case that the receivers do indeed protrude beyond lower surface 54, as is the case shown in FIG. 3A, rather than being totally recessed) may require small adaptations to achieve the desired detection field shape. The relative protrusion of the emitters and receivers can be seen by comparing the position of the short lateral chain line on each sensor which line is either below or above the (lower) outer surface 54 of outer cover 53. In the case of the emitters 20, 12 which are arranged to have the active emitting portion protruding outwardly from the outer surface 54 by a larger extent than the receivers 9, 11 and 13, the line is shown below the outer surface 54 (i.e. outside the outer surface 54), whereas in the case of the active receiving portion of receivers 9, 11, 13, the lines are above the outer surface 54 because the active receiving portion is at least partially recessed behind the outer surface 54 (it may also be fully recessed such that it has no portion thereof protruding outward beyond the surface 54).

In the case shown, the distance "A" of the tip of the emitters 10, 12 from the surface 54 is approximately 3 mm and the distance "B" of the tips of each of the receivers 9, 11, 13 from the surface 54 is about 1 mm. The distances between respective sensors 9-13 is such that $x_1$ approximately equals each of the distances $x_2$, $x_3$ and $x_4$. With the recessed and protruding dimensions of 1 mm and 3 mm respectively, a distance of about 50 mm for each distance $x_1$, $x_2$, $x_3$ and $x_4$ has been found very suitable.

The amount of recessing and protrusion, once the principles of this invention are understood, can be determined by routine experimentation. However, a recessing such that the IR receivers project by distance B of between −2 mm (i.e. totally recessed by 2 mm) and +1.5 mm may be used, although a small positive distance B between 0.2 mm and 1.5 mm is most suitable. Likewise, for the IR emitters, a protrusion of distance A by 2 to 4 mm may be used.

The foregoing configuration of about 3 mm and 1 mm protrusion beyond surface 54, for the emitters and receivers respectively, produces a very favourable tongue shape of the detection zone. The general tongue shape of the detection zone 14 produced is shown in FIG. 3B (which corresponds to the configuration in FIG. 3A) by the dash-dot chain perimeter line 55 indicating the periphery of the area 14. There will be some variation of the shape and also the total length of tongue-shaped zone 14 from the discharge opening 8 in the direction Z (see direction Z in FIG. 2) such that it can vary between about 25 cm and about 50 cm, based on applying varying power to the emitters between 0.001 mAs and 0.1 mAs in steady conditions. The depth of the detection zone 14 shown by dimension C in FIG. 2 will however vary little, even when the length of zone 14 changes in direction Z when power is changed. It remains relatively constant for the arrangement of sensors in the example shown at about 8 cm.

When the current is changed to alter the above range of sensing, it is assumed that a particular range of sensing is required in steady state conditions, since the current changes defined herein relating to average received IR are however concerned not so much with altering the shape of the detection zone 14, but with compensating for background IR while maintaining the approximate same size of detection zone.

In FIG. 3B, the ellipses 56, 57, 58, shown below each of the receivers 9, 11, 13 are smaller than the ellipses 59, 60 shown below each of the emitters 10, 12. This difference in size is due to the recessed and protruding nature of these sensors respectively. The ellipses are however only a way of diagrammatically representing the principal of main field of detection and reception, since practical testing of the exact shape of the detection zone shows that it in fact corresponds to an area 14 bounded by perimeter line 55. A part of a user entering any part of zone 14 bounded by perimeter 55 can thus be detected by the system.

FIG. 3B also shows that a detection blind gap is formed which extends a distance of about 5 cm (with some variation of about 0.5 cm, thus varying between 4.5 cm and 5.5 cm distance), below the lower surface 54 which surface 54 may be substantially at the same vertical level as the discharge outlet 8. The surface 54 may however be arranged such that it lies 1 to 4 cm above the discharge outlet, thereby however still providing an outward surface of the dispenser, such that the intended detection field is not blocked in some way by other parts of the dispenser housing.

The blind gap may however be made to have a distance of preferably between 4 and 6 cm from the lower surface 54 depending on the relative protrusion of the emitters and receivers and their lateral spacing.

The relatively large size of the blind gap is caused largely by the recessing of almost all of the active portion of the receivers behind surface 54 (i.e. vertically above surface 54 in the position of use).

The blind gap is also shown in FIGS. 1 and 2.

The recessing of the receivers 9, 11, 13 (i.e. their lesser protrusion outwardly beyond surface 54 compared to the emitters, or their complete recessing entirely above surface 54) is of particular advantage since it substantially prevents IR signals emitted from shining directly onto all parts of the receivers which can otherwise degrade system reception sensitivity. Furthermore, it reduces IR reflection interference from other directions than the detection zone 14.

This of course assists in providing more reliable sensing, which when combined with the underlying inventive structure described herein, of changing current based on the average background IR, produces a still better result.

As will be explained below in more detail, when a part of a possible user's body enters this first detection zone 14, the sensing system detects the user's presence and causes the sensor system to change from a first scanning rate to a second scanning rate which is higher than said first scanning rate. The sensing system also causes the motor M to turn upon regarding a user (due to the signals received) as being present in a dispensing zone.

This arrangement allows a reliable and accurate IR reception field to be obtained with a shape which is very well suited to the expected hand positioning of a user when the user's hands approach the dispenser.

While a preferred form of the emitter/receiver arrangement as shown in the Figures has certain advantages, the use of only one emitter and two receivers or more than two emitters and three receivers could also be used. Preferably however, to form a desired detection area, there should be one more receiver than emitter when these are arranged consecutively as receiver/emitter/receiver etc. Two receivers (one at each lateral end) should preferably be placed proximate the outer lateral ends of the sensor arrangement (and also thereby the dispenser) to allow for reception of IR over the broadest width of the sensor arrangement in the dispenser and thus make the dispenser more user-friendly by creating a desirable detection zone.

Figure 9:
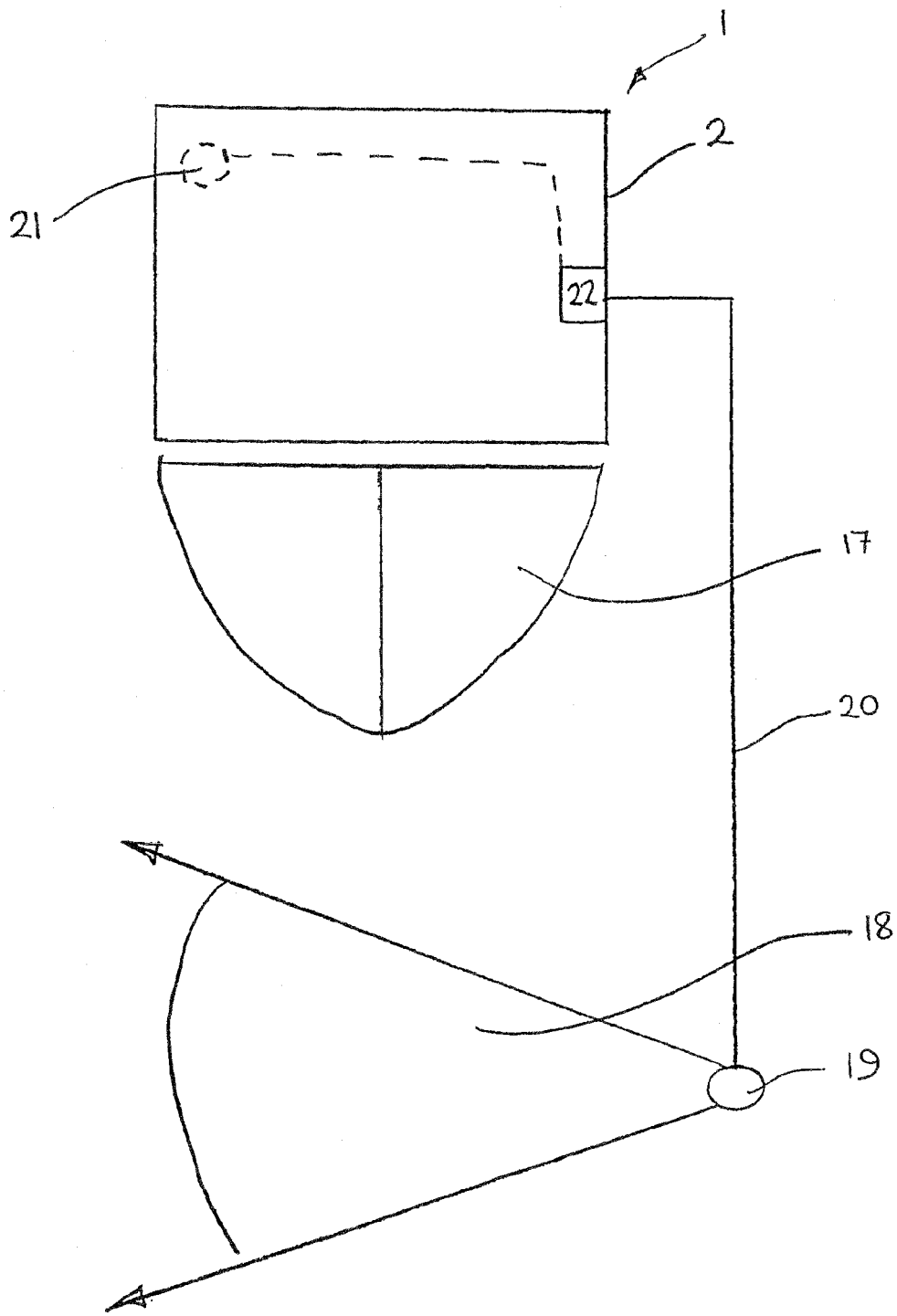
FIG. 9 shows an embodiment using a further sensor, additional to the main active IR sensor system, able to detect a user at a further distance from the dispenser.

In an alternative embodiment shown in FIG. 9, a further sensor 19, remote from the dispenser housing 2 and operatively connected by wireless or wire connection 20 to the sensor system (shown schematically at 22) and its control system in the dispenser housing, may be used to form a first detection zone 18 which is further from the dispenser than the detection zone 17 (detection zone 17 in this case is similar in shape to the first detection zone 14 in FIGS. 1 and 2). Alternatively or additionally, a further sensor may be placed on the front part, e.g. a front surface, of the dispenser housing and facing forwards away from any wall or the like on which the dispenser is mounted, to allow a longer range of detection forwards of the dispenser, such as the sensor 21 shown schematically, which is likewise connected to the sensor system 22. The sensor 19 and/or 21 may for example be arranged to detect the presence of possible users up to a distance of more then the first detection zone, e.g. a distance of more than 50 cm, preferably more than 100 cm, more preferably more than 200 cm, and still more preferably more than 300 cm or even further from the dispenser housing 2.

The emitters 10, 12 of the sensor system are arranged via suitable control circuitry, which may control circuitry as known per se in the art, to emit pulsed IR at a narrow frequency band of for example about 15 kHz ±0.5%. Another IR frequency could however be chosen. The receivers 9, 11, 13, are arranged to detect the emitted IR which is reflected against objects (stationary or moving) back towards the receivers. In order to detect the IR which initiates primarily and almost entirely from the emitted IR (even up to very strong light conditions of 10 000 lux or more), rather than all sources and frequencies of IR radiation due to background influences, the IR receivers need to be tuned to the frequency of the emitters. Thus, the IR receivers are provided with a detection circuit which suppresses IR outside the expected frequency range of the reflected waves, and amplifies the IR at the 15 kHz range level. In this regard, while a frequency detection range both above and below the emitted frequency band range of between 2 to 10 kHz can operate in most situations, it has been found more suitable to use a frequency range (frequency band) which lies about 3 kHz above and also below the central frequency of the emitted IR. Thus, the receivers are tuned (or in other words "synchronized") with the emitted IR at a central frequency of 15 kHz by allowing IR in the range of 12 to 18 kHz to be detected (e.g. by use of a band pass filter set at 12 to 18 kHz). Frequencies outside that band are thus heavily suppressed, while the frequencies within the 12 to 18 kHz band are amplified, with maximum amplification being at the central frequency of about 15 kHz up to for example about 53 dB.

By operating with a modulated frequency in the emitters and receivers, the effects of e.g. bright sunlight which might otherwise cause saturation of the IR received signal compared to any reflected signal are substantially obviated allowing the device to work in light conditions of up to about 10 000 lux background illumination. This ability to distinguish possible users from other background sources of IR is also further enhanced by the possibility of supplying a variable current to the IR emitters as disclosed herein.

Figure 4:
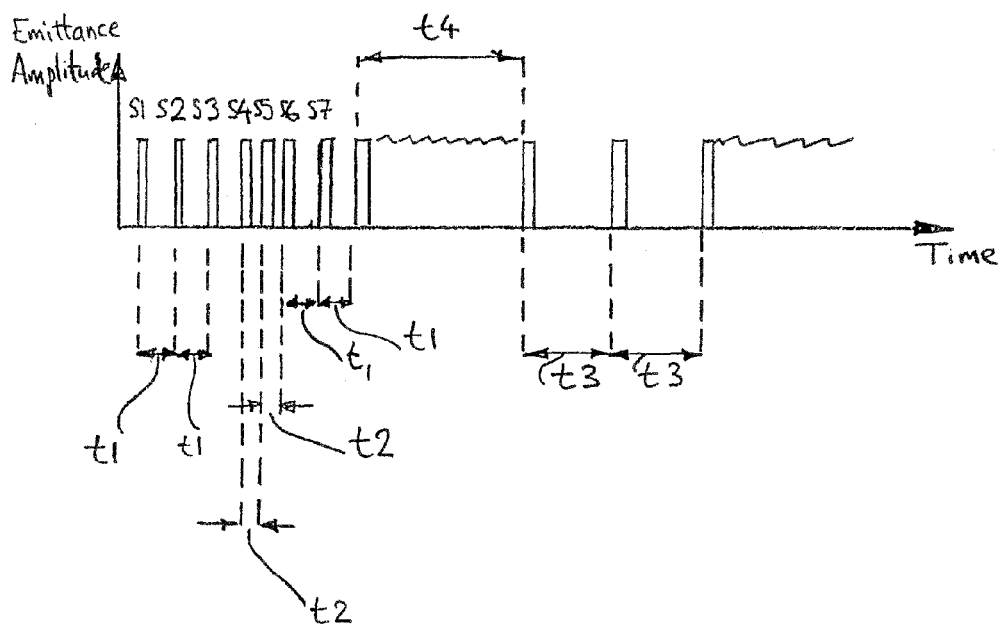
FIG. 4 shows an exemplary plot of emittance amplitude of the scanning pulses against time.

FIG. 4 shows a series of individual scans (i.e. a pulsed IR emission) at a first scanning rate having a time between individual scans of t1, a second scanning rate having a time between individual scans of t2 which is shorter than t1 (i.e. a higher scanning rate than t1) and a third scanning rate having a time between individual scan of t3 where t3 is greater than t1 and t2. The time between individual scans is measured as the time from the start of one single scan to the time of starting the next individual scan. Each of the individual scans is here shown as having the same pulse intensity (i.e. no adjustment is made between individual scans to take account of previous received reflected scans which may result in a different emittance power being supplied to the IR emitters. A further time t4 is shown which is a predetermined time or a predetermined number of pulses separated by time t1 (the first scanning rate) which needs to elapse before the system alters the scanning rate to the third, slowest scanning rate with time interval t3. The pulse width of each individual pulse is normally constant.

The time t1 is set at a constant level to lie between 0.15 to 1.0 seconds, preferably 0.15 to 0.4 seconds, i.e. such that each individual scan pulse is separated by an equal time t1. The time t1 can however be varied and a very suitable rate to optimise the device for battery power saving and reaction time to dispensing has been found to be about t1=0.17 seconds. The second scanning rate is always faster than the first scanning rate and t2 is set to lie preferably between 0.05 to 0.2 seconds, preferably between 0.08 and 0.12 seconds between scans. The time t2 can however be varied to be another suitable value, but preferably lies between 30% to 70% of t1.

Time t3 may be set at for example between 0.3 and 0.6 seconds, although a longer time t3 is also possible, such as 1 second or even longer. However for emittance circuit time triggering (In particular by using an RC triggering circuit using the RC time constant to cause a discharge of current to the microprocessor for initiating timing operation) it is most suitable if t3 is set to double the length of t1. Thus t3 may be set at 0.34 seconds in the case when t1 is 0.17 seconds. The initial time t1 can be made variable, for example via a variable resistor operated from outside the device, although typically this will be factory set so as to avoid unintentional alteration of time t1 which is unsuitable in certain situations.

Time t4 may typically be chosen to be of the order of between 30 seconds to 10 minutes and may also be variably set up in the device dependent on the type of use and surroundings which are normally encountered where the device is to be located. A suitable value for optimised operation has however been found to be about 300 seconds although may also be more, where it is desired to save further power.

Although not shown it will be apparent that additional time periods may also be set in the device with intermediate time periods (i.e. intermediate between the values of T1 and T2 values, or intermediate between t2 and t3 etc) or even greater time periods, dependent on operating conditions, although the use of three different scanning rates has been shown to take account of most situations with good performance in terms of reaction time and power saving. For example, a further time period longer than t4, e.g. 30 minutes, occurring during issuing of scans at interval t3 could be used so as to alter the time period between scans to be longer than t3 (e.g. 10 seconds between individual scans). Such a situation may be useful when the dispenser might not hardly be used for night-time periods. The reason for this will become clearer upon reading the following description of operation.

As can be seen in FIG. 4, after four scans S1-S4 at a time interval of t1, the scanning rate changes to the second faster scanning rate with interval t2 and continues at the second scanning rate for two further scans S5 and S6. The reason for this change will be explained below with reference to FIG. 5.

Figure 5:
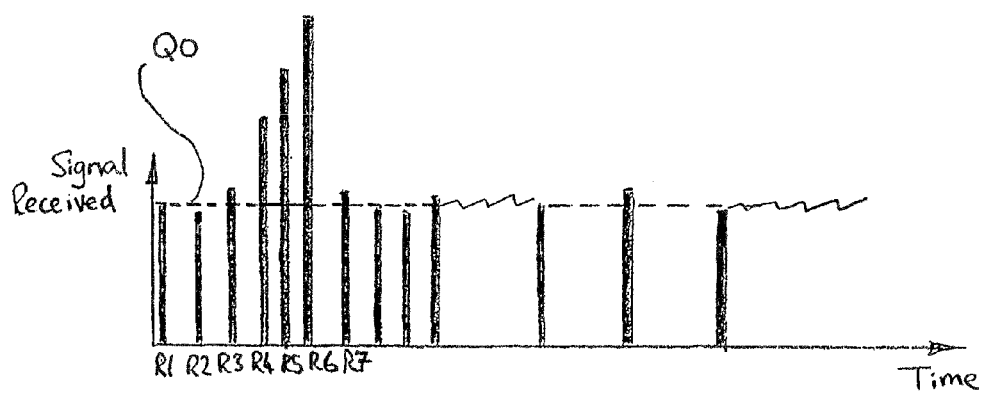
FIG. 5 shows a plot of received signal level against time, for a series of received IR reflections occurring due to the emitted IR pulses in FIG. 4.

FIG. 5 shows a sample of the possible received signal level (received signal strength) of the received signals R1-R7 caused in response to emitting the scan pulses S1-S7.

The approximate background IR level is indicated as a signal received level of Q0. This level Q0 may of course vary and as shown further below this can however be taken into account in several ways. For simplicity of explanation however, it is assumed in the following example to explain the basic sensor system operation for detection and scanning alteration, that Q0 remains substantially constant.

When S1 is emitted and there is no object which is not accounted for in the last background value of received signal, the background level received at R1 will be approximately at level Q0. Likewise at the next scan S2 the level of IR received is also close to Q0 and thus causes no alteration of the first scanning rate. At scan S3, the received signal level R3 is however above background level, but only marginally (e.g. less than a predetermined value, for example less than 10%, above background IR level) and thus the first scanning rate is maintained. Such small changes (below the predetermined level) above and below Q0 can occur due to temporary changes in moisture levels or persons moving at a longer distance from the dispenser, or stray IR due to changes in sunlight conditions or temperature conditions around the dispenser.

At scan S4, the received signal level has reached or surpassed the predetermined value of e.g. 10% above background IR and the sensor system and its control thus assumes that a possible user (e.g. the user's hands or whole body) is moving closer towards the dispenser in order to retrieve a product such as a paper towel. In order to be able to react faster when the user is assumed to wish that a towel to be dispensed (i.e. when the received signal level has reached or surpassed the predetermined value of e.g. 10% above background IR), the scanning rate thus increases to the second scanning rate and thus issues the next scanning pulse at a shorter time t2 after the previous pulse.

If the signal level R5 received on the next scan S5 also fulfils the criteria of being at, or more than, a predetermined level above background IR (e.g. at or greater than 10% above background IR in accordance with the criteria used for the previous scans) the sensor system records via a counter (e.g. in a memory or another form of register) a single detection above the predetermined level, and then issues a further scan S6 at interval t2 to check whether the received IR is still at or above the level of 10% greater than background IR Q0. As shown in FIG. 5, this is the case for scan S6, and the sensor system control (comprising both software and a microprocessor in a preferred form) then immediately issues an output to the motor M to start the motor turning in order to dispense a product (e.g. a portion of paper 7 from roll 3). In this case, i.e. when two consecutive scans are above the predetermined level, the system has thus determined that a possible user is in a zone requiring a product to be dispensed and thus determines that the user is in a "dispensing" zone.

In the case where only one set of sensors is used to detect the presence of a user in the first detection zone (e.g. the embodiment of FIGS. 1 and 2), the detection zone and the dispensing zone will be the same physical zone, but it is merely the sensor control system which logically determines that a user has entered the dispensing zone.

In the embodiment of FIG. 9 however, where an additional sensor 19 and/or 21 is used, the signal level R4 will have been sensed in zone 18 and thus will already have caused the first scanning rate to change to the second scanning rate before the user has entered zone 17 which, in the case of FIG. 9, would be the dispensing zone which is distinct the first detection zone 18. The zones 17 and 18 could of course overlap to a lesser or greater degree, but zone 18 in such a case should always have at least a portion thereof which is arranged to extend further from the dispenser than zone 17. In such a case it is however appropriate for the second scanning rate to be maintained for a time suitable for a user to physically enter the zone 17 (e.g. a time for moving towards a wash basin, washing hands and then using a towel). Such a suitable time may be set for example between 1 and 10 minutes, during which time the second scanning rate is maintained, in the expectation of receiving IR reflected signals R which fulfil the criteria that a product is to be dispensed.

In a further situation, not shown, where the level at R5 is below the predetermined level (e.g. 10% above background IR), the system may be programmed to issue a further scan and to check again whether the received signal level is above the predetermined level so as to indicate that a user is present and wishes to receive a towel. Thus, rather than always requiring two consecutive scans to produce two received signals having a received signal strength above the predetermined level, it has been found preferable to allow any two of three consecutive scans to be above the predetermined level. Further possibilities also exist of course whereby the number of scans to allow dispensing of a towel could be any two out of four consecutive scans, or any three out of four consecutive scans, or further combinations. However, with t1 set at 0.17 seconds and t2 at 0.1 seconds, it has been found suitable to allow any two out of three consecutive scans to trigger dispensing of a product.

In the case shown in FIG. 4, after a towel or other product has been dispensed (discharged), the system alters the scanning rate back to the first scanning rate so as to save power and thus scan S7 is emitted at time t1 after scan S6. Clearly this saves power as early as possible. However, the second scanning rate can however be maintained for longer if desired (situation not depicted in FIG. 4) so that when a user again wishes to take a second or further product (e.g. a further towel) by moving their hands again towards the dispenser outlet, the dispensing occurs quickly again.

In the case shown in FIG. 5 however a case is shown corresponding to FIG. 4, where the user has for example torn off a piece of paper which has been dispensed from the dispenser, and thus the level of IR radiation received at R7 is below the predetermined level (e.g. a level of 10% or more above Q0).

The predetermined level above background level at which the sensor system control causes discharge of a product to occur has been described above as being 10% above background for two out of three consecutive scans. However, practical tests have shown that a more suitable level is at or above 12% greater than background IR, and even more preferably at or above 15% greater than background IR. This is for example to take account of varying light conditions which may occur when a user is close to the dispenser, but not actually wishing to use it.

However, it has also been found in testing that the increase in reflected IR which is received allows entirely different thresholds to be used where desired. Thus for example, the sensor circuits can be tuned such that the predetermined level above background level is up to 90% or more, even up to 95% or more, above background IR, before dispensing occurs. This allows for example a far greater distinction of the reflection from a user's hands compared to any non-desired received IR in the pulsed bandwidth of 12 to 18 kHz (e.g. in the case of very strong light conditions). At the same time, the proximity at which such a high level occurs is generally less than when a lower predetermined level is used, unless the current to the emitters is slightly increased.

In some rare cases users may move their hands very quickly towards the dispenser and may be aggravated by having to wait for a time more than absolutely necessary for the first scanning rate to alter to the second scanning rate and wait a further 0.2 seconds (when using t2=0.1) even though this a negligible time. A further overriding control may thus be included in which any single received scan signal at or above e.g. 30% (or a higher amount such as above 95% in the case described in the preceding paragraph) compared to background level can be used to cause immediate dispensing of a product, without requiring consecutive scans at or above a predetermined level, even when in the first scanning rate mode. This can also be made to apply in the second scanning rate mode.

After a period of inactivity for an extended time period t4 during which the sensing system has been scanning at the first rate, the system can be allowed to assume that there are no possible users in the vicinity of the dispenser. In such a case, even the time t1 may be considered too short to allow optimal power saving, and thus the system can alter the scanning rate to the third scanning rate (lower than the first scanning rate), during which a scanning pulse is issued only once after elapse of time t3. However in such a case, when an IR signal is received which is at or above the predetermined level (e.g. 15% or more above background level), then the system should alter the scanning rate directly to the second higher scanning rate, rather than first adopting the original first scanning rate. However in such a case, it is appropriate to require at least two scans but preferably more scans to cause product dispensing. For example, when a washroom where the dispenser is placed is put into darkness, and then at some time later the lights are turned on, the IR received levels may be considered to determine that a user is present. To avoid a product being dispensed in such a case it may be appropriate to let the system have time to take account of the background IR levels before being allowed to dispense.

In terms of the background level of IR, as mentioned above, this will vary over time. Likewise, the presence of fixed objects (e.g. soap dishes, other containers, or other fixed objects) within the range of the dispenser need to be taken account of as background IR. In order to do this, it has been found suitable to take a moving average of the most recently recorded IR received signals R so as to alter the level Q0 on a continuous basis.

For example, the four (or more or less than four) most recently received IR signal values can be used to form the average value of background signal level by dividing e.g. the sum of the four most recent received signal levels by four for instance. As each new value of IR is received, the oldest value of the four values is moved out of the calculation (e.g. by removing it from a register or store of most recent values in the control circuitry) and calculating a new average based on the most recent values. Calculation of a moving average and the means required to do this in both hardware and/or software for the most recently recorded set of values is very well known in the art of electronics, and thus is deemed to require no further explanation here.

The predetermined number of previous single scans which is used to form the (moving) average is typically between two and ten scans, preferably between three and six scans, and most preferably four or five scans. If three or less scans are used to form the average of received IR and this is used when setting the second current to be supplied to the emitter(s), the difficulty may arise that the last values include high IR values due to a hand being present temporarily and then being removed, which causes an artificially high average value of received IR. This phenomenon can of course be used, if desired, to advantage in setting the current level to the emitter by comparing the set (e.g. three last consecutive scans) of IR received values which caused dispensing to occur, to the most recent set of IR received values which did not cause dispensing to occur. When four or more scans are used this provides more stable results for background IR although use of too many values can cause the dispenser not to react quickly enough to background changes, which thus on some occasions may make the dispenser react more slowly to the presence of a user.

By using a moving average of background IR level, the further advantage is obtained that when a user who has just withdrawn a towel or other product keeps his/her hands at the dispensing outlet, the received IR level will remain high. However, to prevent a user in this way causing discharge of a large amount of product, e.g. paper towel material, the user's hands will be regarded as being background IR when they are relatively stationary and thus dispensing will not occur. To dispense a further product (e.g. paper), the user must therefore move his/her hands away from the dispenser sensors to allow a reading of "true" background IR (i.e. background IR without the user's hands being present too close to the device). Only upon renewed movement of the user's hands towards the dispenser sensors can product dispensing be caused to occur again.

A still further means by which misuse of a dispenser by repeated withdrawing of towels unnecessarily can be prevented is by arranging, in addition or even as an alternative to the above moving average, an adjustable minimum elapsed time between towel dispensing (e.g. a time of between 2 and 10 seconds). However this feature is not generally required since in most cases, the inherent elapsed time for the system to determine a user as being present in the dispensing zone and to turn the motor to dispense a towel, will be sufficient to prevent such misuse.

It will also be appreciated that as the batteries of the dispenser discharge over time, the power supplied to the sensors may also be affected which may cause less efficient operation. To prevent this from occurring, and thus to ensure a stable voltage is available for supply to the sensors (until a time close to total battery depletion), a constant current sink may be employed. Such constant current sinks to provide voltage stability are well known per se in the art of electronics, and thus are deemed to require no further description here, although it will be understood that their use in the sensing circuitry for such a dispenser as described herein is particularly advantageous. The amount of extra energy required to operate the constant current sink is negligible, and thus use of such a device is barely noticeable on battery useable lifetime.

The power supplied to the emitters may additionally be arranged to be varied by an automatic control, suitably between an amount of 0.001 mAs to 0.1 mAs (using a 6V battery installation), in order to take account of received reflected signal strength from previous scans, particularly those resulting in dispensing occurring compared to those which did not cause dispensing (i.e. the latter representing the stable background IR) and to adjust the level of emitted IR to a more suitable level.

This can be achieved by varying the current to the emitters between e.g. 1 mA and 100 mA (i.e. a 100-times variation possibility). This can be done by using the PWM (pulse width modulator) module 106 (to be described later) whereby a square PWM signal is converted to a DC voltage having an output proportional to the PWM duty cycle, and whereby the MCU changes the PWM duty cycle to adjust the DC voltage to the emitter circuits, and thus the power of the IR signal emitted, based on signal strength inputs received by the sensors and sent to the MCU. For example, if the reflected signal strength is very low on the last few scans (e.g. five scans) when dispensing occurred, this may be because the typical brightness of the user's hands is low and background light levels are relatively high. This may cause received signal levels to be only just above the predetermined level compared to background IR unless the user's hands are placed very close to the sensors, which can lead to difficulty in detection in some circumstances. In such a case it may be suitable to increase the power supplied to the IR emitters so as to receive a more easily perceptible signal change, i.e. a first current is increased to a second higher current and this second current applies for the next scanning pulse (or pulses) which will be sent (unless a further change in background IR is detected which may lead to a further change in current sent to the emitter(s)).

Likewise, if the typical brightness of the user's hands is high and background IR levels are low, it may be suitable to decrease the power supplied to the IR emitters as an easily perceivable signal level change (i.e. reflected IR level during dispensing compared to background IR level) is received. In this way, the power supplied to the emitters is still further optimized to take account of such conditions while providing reliable and fast sensing and dispensing. Thus, apart from in very high light conditions, only very low power to the sensors can be used. In this way, it will also be understood that the dispenser can be optimized such that the first detection zone in which the presence of a possible user causes changing from the first to the second scanning rate is selected to lie at between about 20 and 60 cm, preferably between 25 cm and 50 cm from the discharge outlet. It will be apparent that further increases in power to the emitters will increase the range of detection, but the power consumption will increase at a much greater rate and false detections may also occur more easily. Thus, the range of up to 50 cm from the dispenser for allowing detection of a user is a preferred maximum for most installations.

When changing the current level from the first to the second current, it may however be suitable to design the control circuitry such that the first and second level of current are held constant for e.g. at least one second (or even longer) before being allowed to change to a different current level.

By altering the supplied current to the emitters in the above mentioned way, the power supplied to the emitters is optimized to take account of background conditions so as to provide a reliable and fast sensing, and dispensing without using unnecessary battery power.

An alternative, possibly simpler, method which can be used to vary the IR emitter current, rather than by comparing (as above) the values of reflected IR to general background levels, is to set a so-called "standard value" or "threshold value" in the control circuitry, which is a value of the expected detected signal strength received in normal operating conditions. The current supplied might be e.g. 5 mA. If this standard value is called $A1$, then during operation the control circuitry (MCU thereof) can be made to calculate the IR level, $A2$, from a predetermined number of the most recently received IR values (i.e. the moving average of the most recent values). If $A2>A1$ (i.e. the detected reflection moving average signal level $A2$ is above the stored standard signal level $A1$) the current supplied to the emitter can be reduced, preferably in increments. Conversely, in the case where $A2<A1$, then the current supplied to the emitters can be increased, preferably incrementally.

For each single scan the current supplied to the emitter should normally be kept substantially constant. Thus both for a first current level and a second current level, the current is kept substantially constant at that respective current level. As will also be clear, there are not only two current levels possible, since as soon as the second current level is sent in one single scan, that second current level becomes the first current level for the next scanning and the second current level will be the next current level to be set (either up or down or unaltered between each scan), all depending on the results of the most recent moving average of IR received.

The average received IR is calculated from a predetermined number of previous single scans. Preferably, the predetermined number of previous single scans refers to the scans which immediately precede the most recent scan. A suitable predetermined number of scans may be between 2 and 10 scans, preferably between three and six scans, and most preferably four or five scans. For calculating the average received IR, the last (e.g. four) single scans are used and the average value of all IR receiver inputs is used for each scan. On the next average IR which is calculated, the immediately last four single scans are then used again (the oldest scan of the previous scans having now been removed from the calculation).

A further way of performing a background IR measurement, rather than taking the average of the previously received IR values which include the received values of IR reflection from the emitted IR, is to perform a reception scan (i.e. activate the receiving circuits for a small amount of time with the emitters turned off) and measure the level of incoming IR. This can be performed by the MCU for example. An average of a predetermined number of the preceding single reception scans can then be used to form an average value of received IR (with emitter deactivated) in the way already described.

In the case of using turned-off emitters to establish background IR, it may also be suitable to fix a level of received IR (in particular in cases where the remaining battery power is very low so that current levels supplied to the emitters should not, or cannot, be increased further), which lies for example at about 90% of a received value of IR by the IR receiver when the IR emitter is turned on. Other values e.g. of 85% and upwards could however be chosen. Variations of IR at this absolute level of received IR are often too small for accurately being able to differentiate a change in received IR which is caused due to user presence as compared to external influences and this may lead to incorrect dispensing. Such a situation is more likely to occur in dispensers where limited frequency pulsed IR is not used (i.e. opposite to the foregoing limited 15 kHz frequency emission and the 12-18 kHz detection system described above) due to the far lower absolute levels of background IR which are required to saturate the sensor reception system.

It will also be understood that the dispenser can be optimized such that the outermost edge of the first detection zone in which the presence of a possible user causes changing from the first to the second scanning rate, is selected to lie at between about 20 and 60 cm, preferably between 25 cm and 50 cm from the discharge outlet. A further increase in power to the emitters to achieve a longer range will increase the range of detection, but the power consumption will increase at a much greater rate and false detections may also occur more easily despite the additional measure of emitter current supply level.

In a further preferred embodiment, the dispenser can be arranged to have two modes of operation, one being the sensing mode (or "user-sensing" mode) described previously whereby active IR sensing is operating, the other mode being a hanging towel mode whereby each time for example a paper towel is dispensed and also removed (e.g. torn off), a new paper towel is discharged from the dispenser. For this purpose, the cutting edge 16 as shown in FIG. 2 for example could be mounted such that the application of pressure against the cutting edge (often referred to as a cutter bar) causes a switch to be actuated to start the motor M to issue a new piece of towel ready to be torn off. The device may also include a manual switch so that this hanging towel mode can be set manually by a user, or automatically set by a timing circuit, for example at known time periods when the dispenser will normally be in constant use and the use of the active IR sensor system is temporarily superfluous.

A hanging towel mode can also for example be suitable in extremely high background IR conditions (e.g. above 5000 and preferably above 10000 lux) when the IR sensing system is totally saturated and thus cannot detect the difference in the increased level of IR radiation from a user compared to background levels, despite any change from the first current to the second current supplied to the emitters. The dispenser is thus arranged to detect the level of IR radiation against a threshold (i.e. a maximum threshold value), and when said threshold is reached, the sensor control system (i.e. the control system for the sensor system) switches the dispensing mode of the dispenser from a user sensing mode (i.e. the comparison of received IR to background IR for initiating dispensing as described previously) to a hanging towel mode in which a piece of paper sheet towel is fed out of the discharge opening 8 and remains hanging there until it is removed, upon which a further paper towel is fed out of the discharge opening 8 and again remains hanging there.

However, the average received IR detection is preferably still calculated during the time that the hanging towel mode is in operation and the control system is arranged to switch back the mode from hanging towel mode to dispensing mode when the value of average received IR drops below the threshold value.

Immediate switching back may not always be suitable, since the average IR may have dropped only temporarily below the threshold and the device could be switching constantly between hanging and user sensing modes which may confuse a user. Thus, it may be preferable to include a time delay of a first predetermined time (e.g. five seconds or more, or even longer time periods) before switching back to the user-sensing mode.

An even further improvement may be achieved by arranging the control system software (or optionally hardware) to prevent switching back to the user-sensing mode during the first predetermined time period if value of the average received IR during that time is above the maximum IR threshold. Again, this helps to further smooth out the effects of temporary background IR changes.

In a dispenser using emitted pulsed IR (e.g. at 15 kHz AC voltage as explained above) the level of background IR caused in particular by light (containing all frequencies of IR) at which such a change to hanging towel mode is required will normally be a very high level (e.g. up to or more than 10 000 lux). However, the mode change from user sensing mode to hanging towel mode is particularly advantageous in a cheaper type of dispenser system where the IR is not pulsed, but merely a broad frequency band of IR is emitted and a broad frequency band is received. In such cases, the level of saturation of receiving side of the sensor system occurs at much lower levels of light (e.g. of the order of 1000 lux). Thus, the switch from user sensing mode to hanging towel mode would offer a useful addition to such devices without incurring the expense of a limited pulsed frequency emission and special amplifiers and filters on the receiver side.

A further occasion on which it may be useful to switch to hanging towel mode is at a time close to battery depletion, when the power consumption of the active IR sensing system is unsuitably high for the remaining power of the batteries (when related to the normal usage to which the device is put). In such a case of low battery power, automatic switching (by the dispenser control system including the sensing system) to the hanging towel mode and turning off the emitters used for the sensing mode can be used. Alternatively, the device can be fitted with a low battery power warning indicator which could be used by an attendant to move a manual switch to a hanging towel mode temporarily before replacing the batteries.

Figure 6:
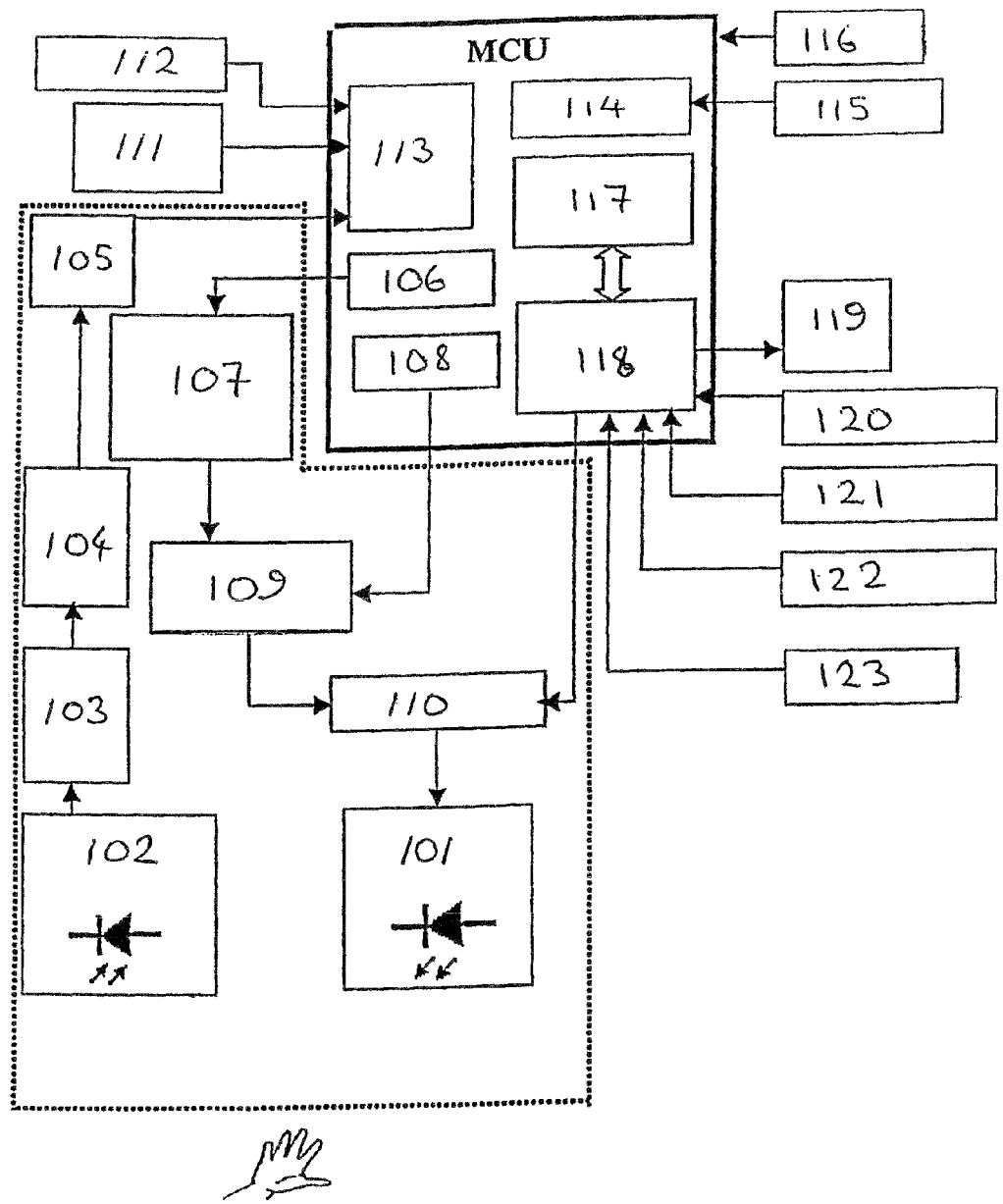
FIG. 6 shows a block diagram of the basic system elements of an embodiment of a dispenser according to the invention.

FIG. 6 shows a block diagram of the basic system of one embodiment of a dispenser according to the invention, in which the portion shown in dotted lines includes the basic components for IR signal modulation, IR emission and IR reception used to submit a sensing signal to the A/D modulation of the master control unit (MCU) which unit contains a microprocessor.

Box 101 and 102 denote IR emitter(s) and receiver(s) respectively corresponding generally to the previously described emitters 10, 12 and receivers 9, 11, 13 described above. These IR emitters and receivers are preferably photodiodes. The hand shown outside the dotted lines indicates that IR radiation emitted by the emitter(s) 101 is reflected by the hand back to receiver(s) 102. Unit 103 is a photo-electric converter for converting the received IR signal before it is passed to filtering and amplification unit 104 where the band pass filter and amplification circuits operate to amplify the received signal around the central frequency in a limited band width and to thereby suppress other IR frequencies relatively. The signal is then passed to a signal rectification unit 105, since the IR signal is an AC signal. From the unit 105, the signal passes into the A/D module of the MCU.

The output of the PWM module 106 is controlled by the MCU such that a square wave signal from the PWM can have its duty cycle varied by the MCU to adjust the DC voltage to the emitter circuits and thus the power of the IR signal emitted. The PWM 106 is connected to a D/A converter 107 and into an IR emitter driving circuitry unit 109 which includes the constant current sink mentioned previously. Into the same IR emitter driving circuitry is also fed a signal from a phase frequency detection module 108 which issues a 15 kHz (±0.5%) impulse modulated signal (or another frequency of modulated signal as considered appropriate) so as to drive the emitters 101 via the emitter driving circuitry 109 to emit modulated IR signals for short intervals (e.g. each signal is emitted for about 1 ms). In this regard it should be noted that before the modulated signal is emitted, the MCU should first have already put the filter and amplification circuit unit 104 for the received signal into operation for a short period, e.g. 2.5 ms, before emitting a modulated pulse, so as to allow the receiver circuit to stabilise so as to reliably detect reflected IR from the emitted IR signal. Since the unit 104 is already in operation when the IR scanning pulse is emitted, and since the filters and amplification unit are centered around the central frequency of the emitted pulse, there is no need to synchronise the timing of the emitted pulse and the received pulse to any further extent.

The signal from unit 109 feeds into the IR emitter on/off control unit 110. The input/output module 118 of the MCU also feeds into the unit 110 to be turned on and off as required to thereby perform an IR scan via the emitter 101.

In order to activate the microprocessor (i.e. wake it up to perform a scan at a certain rate), RC wake-up circuitry 115 feeds into the MCU into a wake-up detection unit 114. Unit 117 is an external interrupt detection unit.

From the input output module 118 is a feed to unit 119 which can be regarded as the motor driving circuitry which drives the motor M when the sensor system (which preferably includes the MCU and software) has detected that a product should be dispensed due to the determination of the presence of a user in the dispensing zone.

Further peripheral units 111, 112 are respectively a paper sensing circuit unit and a low power detection circuit (i.e. for detecting batteries close to depletion). Unit 116 indicates battery power which is used to drive the MCU and also all other peripherals and the motor. Unit 120 may be motor overload circuitry which cuts off power to the motor for example when paper becomes jammed in the dispenser or when there is no paper in the dispenser. Unit 121 is a paper length control unit, which operates such that a constant length of paper (which is itself variably adjustable by manual operation e.g. of a variable resistor or the like) each time the motor is made to operate to dispense a length of paper sheet 7 through the discharge opening 8. This unit 121 may also include a low power compensation module by which the motor under lower power is made to turn for a longer period of time in order to dispense the same length of paper sheet, although the unit may simply be a pulse position control system whereby the rotation of the motor is counted in a series of pulses and the rotation is stopped only when the exact number of pulses has been achieved. Such a pulse position control system could include for example a fixedly located photointerruptor which can detect slots in a corresponding slotted unit fixed to the motor drive shaft (or alternatively on the drive roller 5 operably connected to the drive motor). Unit 122 may be low paper detection circuitry and unit 123 may be a unit used to indicate whether the casing is open or closed. This can for example be used to provide automatic feeding of a first portion of paper from the paper roll through the discharge opening when the case is closed, e.g. after refilling with a new roll of paper, so that the person refilling the dispenser is assured that the device is dispensing properly after having been closed.

Although not shown here, a series of warning or status indication lights may be associated for example with various units such as units 111, 112, 120 to 123 to indicate particular conditions to a potential user or dispenser attendant or repairman (e.g. if the dispenser motor is jammed or the dispenser needs refilling with paper or the like).

Figure 7:
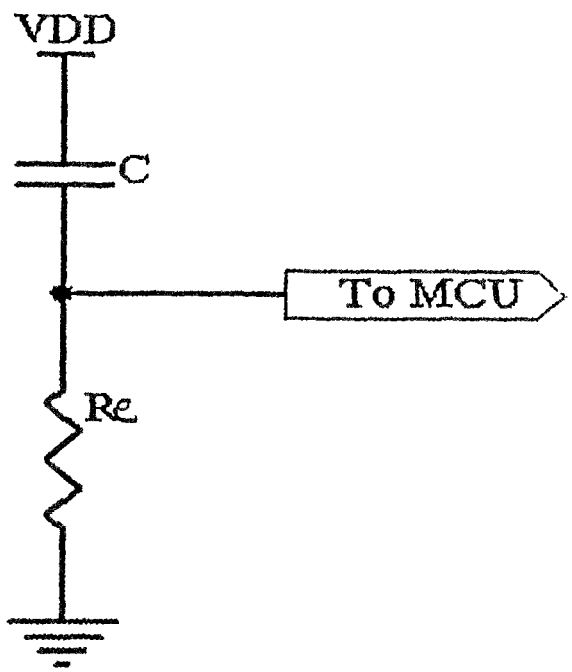
FIG. 7 shows an RC circuit used for effecting wake-up of the microprocessor in the MCU so as to perform a scan.

FIG. 7 shows one embodiment of an RC control circuitry which can be used to give a timed wake-up of the microprocessor in the MCU. The principle of such a circuit is well known and in the present case a suitable value for the resistor Re is 820 kOhm and for the capacitor 0.33 microfarads. Although not shown specifically in FIG. 6, the RC wake-up circuitry uses the input/output unit 118 of the MCU to provide the timed wake-up function of the microprocessor so that a scan occurs at the prescribed time interval (t1, t2 or t3 for example). When there is a high to low voltage drop at the input/output, as a result of the RC circuitry, the MCU will "wake-up" and perform a scan. This wake-up leading to the performing of a scan also requires supporting software. Likewise, the length of the time t1 and/or t2 and/or t3 can suitably be made as a multiple of the RC circuitry time constant, whereby the input from the RC circuit can be used in the software to determine whether a scan is required or not at each interval. In this regard, it will be noted that an RC circuit is subject to voltage changes at the input (via VDD which is the MCU supply voltage source acquired after passing through a diode from the battery voltage supply). As the voltage of the battery (or batteries) drops, there will then be an increase in the RC time constant in the circuit of FIG. 7 and thus the times t1, t2 and t3 set initially will vary as the batteries become more depleted. For example, with the time t1 set at the preferred level of 0.17 seconds for a battery level of 6V, a drop to depletion level of 4.2V will increase time t1 to 0.22 s. Thus, the values of t1, t2, t3 etc., as used herein, are to be understood as being the values with a fully charged battery source.

Figure 8:
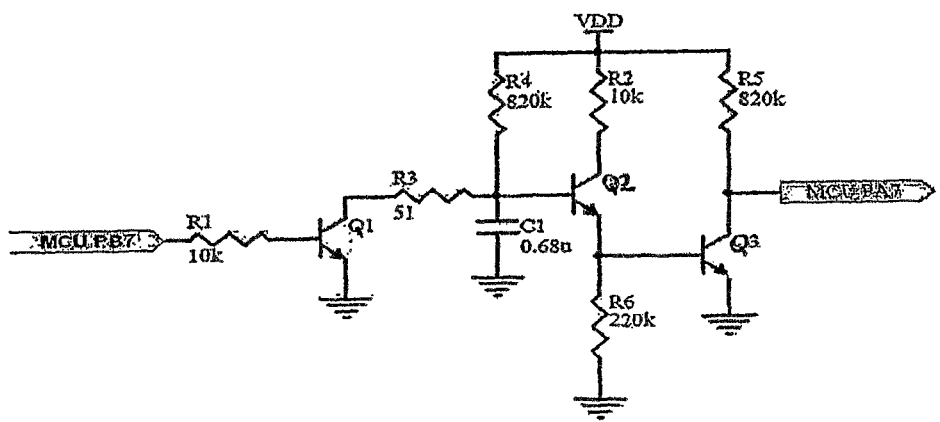
FIG. 8 shows an alternative version of the RC circuit depicted in FIG. 7.

FIG. 8 shows a modified RC circuit which has the advantage of using less current than the circuit shown in FIG. 7. In FIG. 8, three bipolar transistors are used to minimise the current used when the MCU is asleep.

Under normal conditions, the digital circuitry inside the MCU operates in a logic High voltage state and a logic Low voltage state at which the current drain is very low. However when the RS-wake-up circuitry is connected as in FIG. 7 (whereby the indication "to MCU" implies a connection to the input/output port of the MCU) this creates a voltage change at the input/output port of the MCU which is a progressive voltage change, due to the charging and discharging process in the RC circuit. This creates a relatively long working period for the digital circuitry in the MCU, in turn resulting in an internally higher current consumption in the IC internal circuitry than is present during normal operation conditions. This results in somewhat higher power consumption to the MCU during its "off" cycle (i.e. the "sleep" cycle of the MCU).

By the circuitry in FIG. 8, the modification includes the use of two input/output ports PA7 (right hand side in the Figure) and PB7 (left hand side in the Figure) to the MCU. The important aspect of this circuit is that two transistors Q2 and Q3 have been added in cascade which together modify the RC charge-up characteristics. The MCU PA7 pin then gives a much sharper charge-up curve. The delay time constant for waking up the MCU is determined by R4 and C1, which have been given values of 820 kOhm and 0.68 μF respectively in the example shown. Other values for other time constants can of course be chosen.

The fast voltage change at port PA7 is achieved after conversion in Q2 and Q3, which minimizes the time required for transition from a logic High voltage to a logic Low voltage level. Such a circuit as in FIG. 8 can achieve about 40% power reduction during the sleep cycle compared to the FIG. 7 circuitry for approximately the same RC time constants. Thus, the RC timing circuitry of FIG. 8 is particularly advantageous where maximum power is to be saved.

The invention claimed is:

1. A dispenser for automatically dispensing a product stored in a product supply of said dispenser, said dispenser comprising an electric power supply and an active IR sensing system, said IR sensor system including at least one IR emitter and at least one IR receiver, wherein said IR sensing system is arranged to scan for the presence of a possible user at least at a first scanning rate, and wherein a sensor control system is provided such that said active IR emitter is supplied with a first current which is substantially constant during one or more single scans but which can be altered to a different, second substantially constant current for further scanning, said first and second currents being determined on the basis of a signal strength of the average received IR which is received by said at least one IR receiver during a predetermined number of previous single scans, wherein said dispenser is a paper towel dispenser, and the sensor control system is arranged to detect a maximum threshold value of average received IR, upon which said sensor control system switches a dispensing mode of said dispenser from a user sensing mode to a hanging towel mode.

2. The dispenser according to claim 1, wherein said second current is made higher than said first current when the average IR received by said IR receiver increases from a first average received IR to a second higher average received IR, and is made lower than said first current when the average IR received by said IR receiver decreases from a first average received IR to a second lower average received IR.

3. The dispenser according to claim 1, wherein a first standard value Al has been set in the control circuitry, corresponding to a value of the expected detected signal strength received in normal operating conditions, and wherein the control system is arranged to calculate a moving average A2 of a predetermined number of the most recently received IR values, and when A2 >A1 the current supplied to the emitter is reduced, and in the case where A2 <Al, the current supplied to the emitters is increased.

4. The dispenser according to claim 1, wherein said predetermined number of previous single scans is between two and ten.

5. The dispenser according to claim 1, wherein said first current and said second current can be varied within fixed maximum and minimum limits.

6. The dispenser according to claim 5, wherein the maximum limit is between 10 and 150 greater than said minimum limit.

7. The dispenser according to claim 1, wherein said sensor system can also scan at a second scanning rate, and wherein said second scanning rate is higher than said first scanning rate, wherein the sensor system is arranged to change said scanning rate from said first scanning rate to said second scanning rate upon receiving a reflected IR level greater than a predetermined value above background IR level for a first predetermined number of single scans, and wherein said sensor system causes a product to be dispensed by said dispenser when said sensor system detects a change in received IR signal strength which is at or greater than a predetermined IR signal strength level above a background IR signal strength level for a second predetermined number of single scans.

8. The dispenser according to claim 7, wherein said predetermined signal strength level is at or above 10% higher than background.

9. The dispenser according to claim 1, wherein said sensor system comprises a plurality of IR receivers and at least one IR emitter, and the value of received IR values at all receivers is used to form a single average value of received IR during one single scan.

10. The dispenser according to claim 9, wherein said sensor system comprises at least two IR emitters and at least three IR receivers, wherein each emitter has one receiver on each lateral side thereof such that the emitters and receivers are in the order receiver-emitter-receiver -emitter-receiver in a lateral direction across the dispenser, and wherein the spacing between each emitter and each laterally adjacent receiver is substantially equal.

11. The dispenser according to claim 1, wherein said dispenser comprises a discharge outlet on or proximate a lower face thereof, and wherein each of said emitters and receivers is arranged on said lower face.

12. The dispenser according to claim 1, wherein said dispenser is a paper towel dispenser arranged to both store a supply of paper and to dispense at least a portion of said supply of paper.

13. The dispenser according to claim 1, wherein said IR emitters are controlled by a sensor control system to provide IR radiation to a level such that the detection field provided by said emitters is able to detect the presence of a possible user at a distance of up to 25 cm from said discharge outlet.

14. The dispenser according to claim 1, wherein said sensor system is arranged to emit IR radiation only with a first emitting frequency band and wherein said sensor system is arranged to detect radiation in a limited frequency detection range, wherein said first emitting frequency is about 15 kHz and said frequency detection range is between about 12 kHz and about 18 kHz.

15. The dispenser according to claim 1, wherein said sensor control system switches said dispensing mode from said hanging towel mode to said user sensing mode when the average received IR is measured to lie below said maximum threshold value.

16. The dispenser according to claim 15, wherein said control system is arranged with a time delay such that when the average received IR is measured to lie below said maximum threshold value said switching operation from said hanging towel mode to said user sensing mode is delayed for at least a first predetermined time.

17. The dispenser according to claim 16, wherein said first predetermined time is at least five seconds.

18. The dispenser according to claim 16, wherein said control system is arranged to prevent switching to said user sensing mode if within said first predetermined time, said maximum threshold value is exceeded.

19. The dispenser according to claim 15, wherein said control system is arranged to prevent switching to said user sensing mode if within said first predetermined time, said maximum threshold value is exceeded.

20. The dispenser according to claim 1, in which the average value of received IR is measured with the IR emitter turned off.

21. The dispenser according to claim 20, wherein the sensor control system is arranged such that when the average value of received IR with the IR emitter turned off is above 90% of the average value of received IR with the IR emitter turned on, a user sensing mode is disabled.

22. The dispenser according to claim 21, wherein said control system switches to a hanging towel mode after disabling the user sensing mode.

23. The dispenser according to claim 21, wherein said control system switches from said hanging towel mode back to said user-sensing mode, upon detecting that the average value of received IR with the IR emitter turned off is at or below 90% of the average value of received IR with the IR emitter turned on.

24. The dispenser according to claim 1, wherein a constant current sink is used to provide a constant current to the IR emitter.

* * * * *